United States Patent
Lin

(10) Patent No.: US 7,680,238 B2
(45) Date of Patent: Mar. 16, 2010

(54) FREQUENCY DIVIDER CIRCUIT

(75) Inventor: Heng Li Lin, Hsinchu (TW)

(73) Assignee: Advanced Analog Technology, Inc., Hsinchu (TW)

( * ) Notice: Subject to any disclaimer, the term of this patent is extended or adjusted under 35 U.S.C. 154(b) by 53 days.

(21) Appl. No.: 12/179,139

(22) Filed: Jul. 24, 2008

(65) Prior Publication Data

US 2009/0289671 A1 Nov. 26, 2009

(30) Foreign Application Priority Data

May 21, 2008 (TW) .............................. 97118611 A

(51) Int. Cl.
*H03K 21/00* (2006.01)
*H03K 23/00* (2006.01)
(52) U.S. Cl. ............................. 377/47; 377/48; 327/115; 327/117
(58) Field of Classification Search .................. None
See application file for complete search history.

(56) References Cited

U.S. PATENT DOCUMENTS

| 4,348,640 | A | | 9/1982 | Clendening et al. |
| 5,886,562 | A | * | 3/1999 | Garrity et al. ................ 327/415 |
| 6,389,095 | B1 | | 5/2002 | Sun et al. |
| 7,046,052 | B1 | * | 5/2006 | Percey et al. ................. 327/115 |
| 7,149,275 | B1 | * | 12/2006 | Hubbard ....................... 377/47 |
| 2008/0258781 | A1 | * | 10/2008 | Song et al. ................... 327/117 |

* cited by examiner

*Primary Examiner*—Tuan Lam
(74) *Attorney, Agent, or Firm*—WPAT, P.C.; Anthony King

(57) ABSTRACT

A frequency divider circuit comprises a plurality of T flip-flops, a first transmission gate, a second transmission gate and an inverter. The plurality of T flip-flops is connected in series. The output of the inverter is connected to a clock input of a first T flip-flop. The first transmission gate connects a clock signal and the other clock input of the first T flip-flop and the input of the inverter. The second transmission gate connects the inverted signal of the clock signal and the output of the first transmission gate.

5 Claims, 5 Drawing Sheets

FREQUENCY DIVIDER CIRCUIT

BACKGROUND OF THE INVENTION

1. Field of the Invention

The present invention relates to a circuit, and more particularly, to a frequency divider circuit.

2. Description of the Related Art

When designing a circuit, there is usually a need for clock signals of periods different from that of the main clock signal. Power supporting circuits, for example, usually require clock signals of different periods for different channels of power outputs such that the total amount of power output is more uniformly distributed over time. However, it is not efficient to design corresponding clock generating circuits for every clock signal of a different period. Therefore, there is a need for a frequency divider circuit which divides the frequency of a clock signal to generate clock signals of different periods. The ratios of the periods of clock signals generated by an ordinary frequency divider circuit to the period of the original clock signal are usually exponents of 2, such as 2, 4 or 8. The applications of ordinary frequency divider circuits are thus limited.

U.S. Pat. No. 4,348,640 discloses a frequency divider circuit comprising three JK flip-flops and five logic gates, wherein the frequency divider circuit down-converts a clock signal into another signal with a period three times of the period of the original clock signal. However, the frequency divider circuit requires a lot of flip-flops and logic gates, and also requires a lot of effort to be adapted to generate signals of different periods.

U.S. Pat. No. 6,389,095 discloses a frequency divider circuit comprising two D flip-flops, an OR gate and a NOR gate, wherein the frequency divider circuit down-converts a clock signal into another signal with a period three times of the period of the original clock signal. Even though the frequency divider circuit reduces the number of the required transistors, it still requires an OR gate and a NOR gate. In CMOS manufacturing process, the frequency divider circuit requires at least 10 transistors, which does not meet the requirement for cost efficiency. In addition, the frequency divider circuit requires a lot of effort to be adapted to generate signals of different periods, and hence its usage is limited.

Accordingly, there is a need to design a frequency divider circuit with simple structure that can be easily adapted to generate signals of different periods to meet the requirement of modern circuit design.

SUMMARY OF THE INVENTION

The frequency divider circuit according to one embodiment of the present invention comprises a plurality of T flip-flops, an inverter, a first transmission gate and a second transmission gate. The plurality of T flip-flops is connected in series, wherein one of the output terminals of each T flip-flop is connected to one of the clock terminals of the following T flip-flop, the other output terminal of each T flip-flop is connected to the other clock terminal of the following T flip-flop, and the toggle terminal of each T flip-flop is connected to logic 1. The output terminal of the inverter is connected to one of the clock terminals of a first flip-flop. The first transmission gate connects a clock signal to the other clock terminal of the first T flip-flop and the input terminal of the inverter. The second transmission gate connects the inverted signal of the clock signal to the other clock terminal of the first T flip-flop and the input terminal of the inverter. The first transmission gate and the second transmission gate are controlled by the last T flip-flop.

The frequency divider circuit according to another embodiment of the present invention comprises a plurality of T flip-flops and a transmission gate circuit. The plurality of T flip-flops is connected in series. The transmission gate circuit connects a clock signal and the inverted signal thereof to the clock terminals of a first T flip-flop. Each T flip-flop has twice as many logic transitions as the following T flip-flop. When the output logic of a last T flip-flop changes, the transmission gate circuit changes its output signals into the inverted signals of its previous output signals.

BRIEF DESCRIPTION OF THE DRAWINGS

The objectives and advantages of the present invention will become apparent upon reading the following description and upon referring to the accompanying drawings among which.

DETAILED DESCRIPTION OF THE INVENTION

Figure 1:
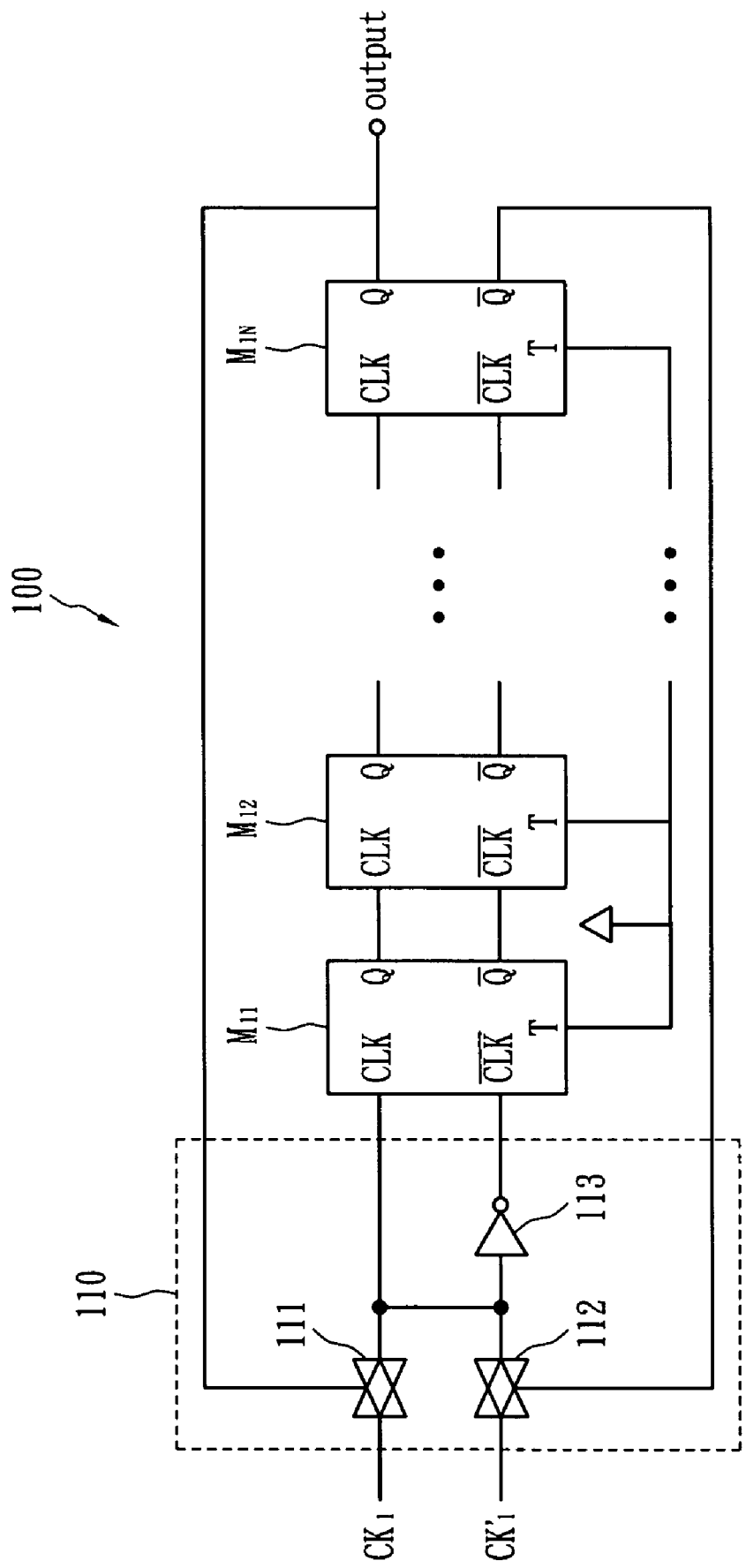
FIG. 1 shows a block diagram of the frequency divider circuit according to the first embodiment of the present invention.

FIG. 1 shows a block diagram of the frequency divider circuit according to one embodiment of the present invention. The frequency divider circuit 100 comprises a plurality of T flip-flops $M_{11}$ to $M_{1N}$ and a transmission gate circuit 110. The plurality of T flip-flops $M_{11}$ to $M_{1N}$ is connected in series, wherein one of the output terminals of each T flip-flop is connected to one of the clock terminals of the following T flip-flop, the other output terminal of the T flip-flop is connected to the other clock terminal of the following T flip-flop, and the toggle terminal of each T flip-flop is connected to logic 1, as shown in FIG. 1. The output terminal of the last T flip-flop $M_{1N}$ is connected to and controls the transmission gate circuit 110. The transmission gate circuit 110 connects a clock signal $CK_1$ and the inverted signal $\overline{CK_1}$ thereof to the clock terminals of the first T flip-flop $M_{11}$.

The transmission gate circuit 110 comprises a first transmission gate 111, a second transmission gate 112 and an inverter 113. The output terminal of the inverter 113 is connected to one of the clock terminals of the first flip-flop $M_{11}$. The first transmission gate 111 connects the clock signal $CK_1$ to the other clock terminal of the first T flip-flop $M_{11}$ and the input terminal of the inverter 113. The second transmission gate 112 connects the inverted clock signal $CK_1'$ to the other clock terminal of the first T flip-flop $M_{11}$ and the input terminal of the inverter 113.

The operation of the frequency divider circuit 100 is described as follows. One of the output terminals of the last T flip-flop $M_{1N}$ controls the first transmission gate 111. The other output terminal of the last T flip-flop $M_{1N}$ controls the second transmission gate 112. Therefore, only one transmission gate is turned on at any given time such that the transmission gate circuit 110 either outputs the clock signal $CK_1$ and its inverted signal, or the inverted clock signal $CK_1'$ and its inverted signal, to the clock terminals of the first T flip-flop $M_{11}$.

The toggle terminal of the first T flip-flop $M_{11}$ is connected to logic 1. When the signal received at the positive clock terminal of the first T flip-flop $M_{11}$ changes from logic 0 to logic 1, the output signal of the first T flip-flop $M_{11}$ changes accordingly. Therefore, the number of logic transitions of the signal at the positive clock terminal of the first T flip-flop $M_{11}$ is twice as many as that of the signal at the output terminal of the first T flip-flop $M_{11}$. The output terminal of the first T flip-flop $M_{11}$ is connected to the positive clock terminal of a second T flip-flop $M_{12}$. The toggle terminal of the second T flip-flop $M_{12}$ is connected to logic 1 as well. Therefore, the number of logic transitions of the output signal of the second T flip-flop $M_{12}$ is half as many as that of the output signal of the first T flip-flop $M_{11}$. The rest may be deduced by analogy: during any given clock period, the number of logic transition times of the output signal of any T flip-flop is twice as many as that of the output signal of the following T flip-flop.

When the output signal of the last T flip-flop $M_{1N}$ changes its logic state, the transmission gate circuit 110 switches the transmitted signal to the inverted signal of the original one. Therefore, the signal at the positive terminal of the first T flip-flop $M_{11}$ becomes the inverted signal thereof. That is, there is a half period of clock signal being skipped. As to the clock signal $CK_1$, when the logic state of the clock signal $CK_1$ changes $2^N-1$ times, the logic state of the output signals of the transmission gate circuit 110 changes $2^N$ times. The rest may be deduced by analogy: when the logic state of the clock signal $CK_1$ changes $2^N-1$ times, the logic states of the output signal of the first T flip-flop $M_{11}$ changes $2^{N-1}$ times, the logic state of the output signals of the second T flip-flop $M_{12}$ change $2^{N-2}$ times, and the logic state of the output signals of the last T flip-flop $M_{1N}$ change one time. Therefore, the period of the output signal of the last T flip-flop $M_{1N}$ is $2^N-1$ times as long as that of the clock signal $CK_1$.

On the other hand, because there is a half period of clock signal being skipped for every $2^N-1$ transitions of the output signal of the transmission gate circuit 110, there is no T flip-flop exhibiting a duty cycle of 50% except for the last T flip-flop $M_{1N}$. In other words, all of the T flip-flops exhibit the same period except for the last T flip-flop $M_{1N}$, which exhibits a period twice as long as all the other T flip-flops.

The inverter 113 can be connected to either the positive clock terminal or the negative clock terminal of the first T flip-flop $M_{11}$. The output terminals of each T flip-flop can be connected to either the positive clock terminal or the negative clock terminal of following T flip-flop. Different connection only affects the relative phase of the output signal of the frequency divider circuit 100, but the period of the output signal of the frequency divider circuit 100 remains the same.

Figure 2:
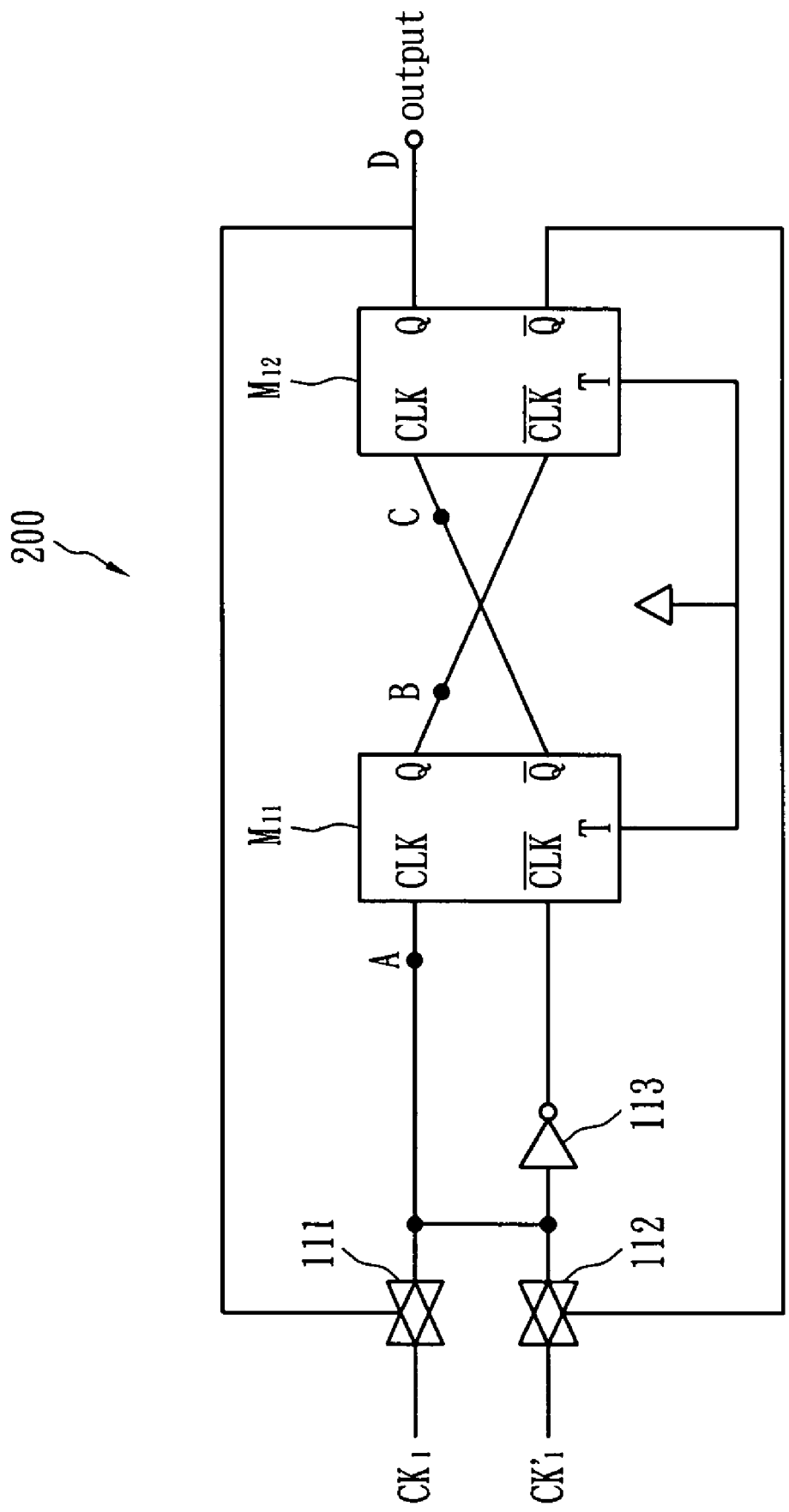
FIG. 2 shows a block diagram of the frequency divider circuit according to the second embodiment of the present invention.

FIG. 2 shows a block diagram of the frequency divider circuit according to another embodiment of the present invention. The frequency divider circuit 200 is similar to the frequency divider circuit 100 with N equal to 2. The frequency divider circuit 200 comprises the first T flip-flop $M_{11}$, the second T flip-flop $M_{12}$, the first transmission gate 111, the second transmission gate 112 and the inverter 113. The input terminal of the first transmission gate 111 is connected to the clock signal $CK_1$. The output terminal of the first transmission gate 111 is connected to the positive clock terminal of the first T flip-flop $M_{11}$ and the input terminal of the inverter 113. The input terminal of the second transmission gate 112 is connected to the inverted signal $CK_1'$ of the clock signal $CK_1$. The output terminal of the second transmission gate 112 is connected to the positive clock terminal of the first T flip-flop $M_{11}$ and the input terminal of the inverter 113. The output terminal of the inverter 113 is connected to the negative clock terminal of the first T flip-flop $M_{11}$. The positive output terminal of the first T flip-flop $M_{11}$ is connected to the negative clock terminal of the second T flip-flop $M_{12}$. The negative output terminal of the first T flip-flop $M_{11}$ is connected to the positive clock terminal of the second T flip-flop $M_{12}$. The positive output terminal of the second T flip-flop $M_{12}$ is connected to the control terminal of the first transmission gate 111. The negative output terminal of the second T flip-flop $M_{12}$ is connected to the control terminal of the second transmission gate 112.

Figure 3:
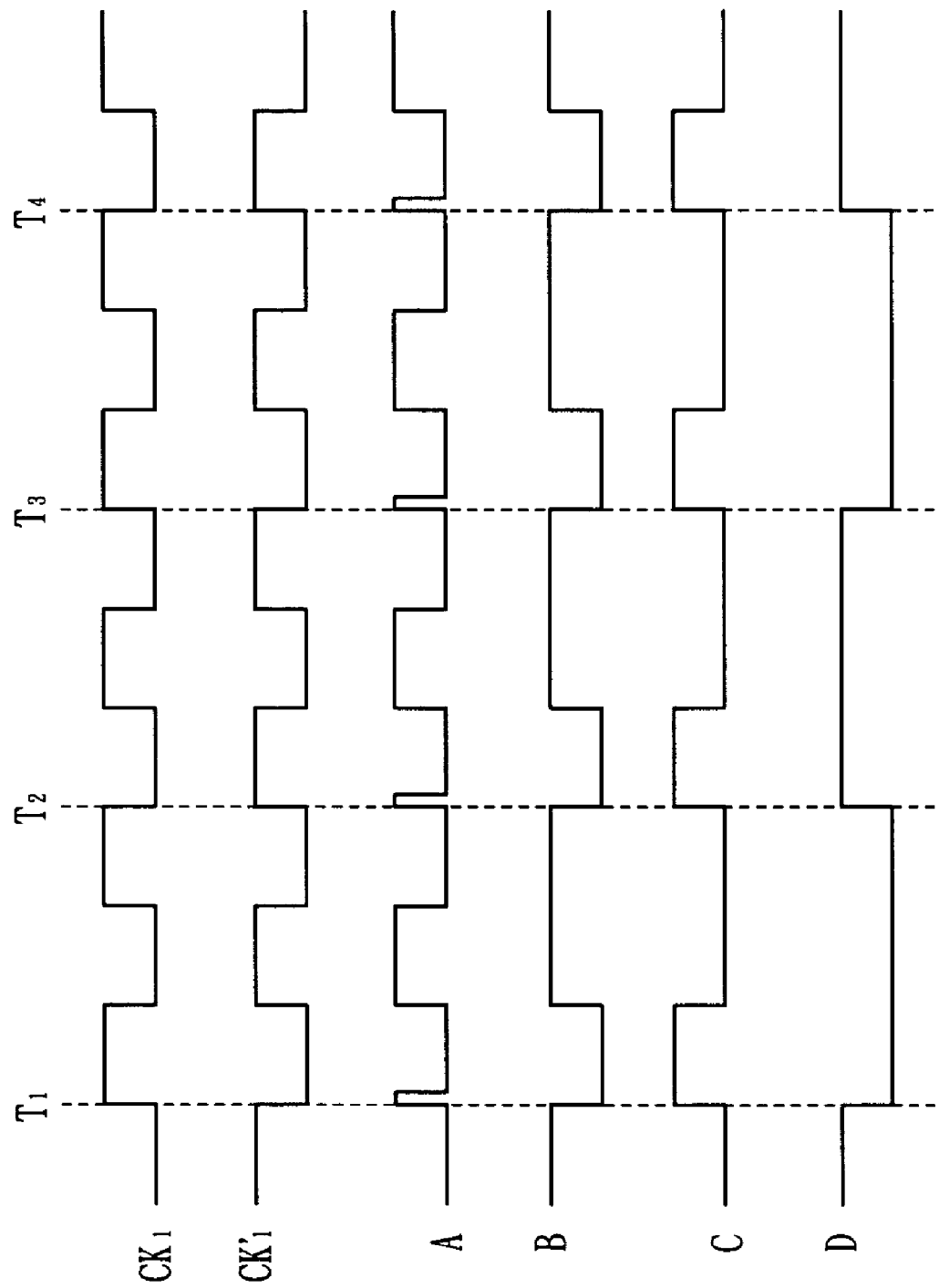
FIG. 3 shows a timing diagram of the voltages in the second embodiment of the present invention.

FIG. 3 shows a timing diagram of voltage of each point in FIG. 2. The initial outputs of the first T flip-flop $M_{11}$ and the second T flip-flop $M_{12}$ are logic 1. Accordingly, the first transmission gate 111 is turned on, the second transmission gate 112 is turned off, and the signal at point A is the clock signal $CK_1$. At time $T_1$, the signal at point A changes from logic 0 to logic 1, which triggers the first T flip-flop $M_{11}$ such that the signal at point B changes from logic 1 to logic 0, and the signal at point C changes from logic 0 to logic 1. The logic transition at point C triggers the second T flip-flop $M_{12}$ such the signal at point D changes from logic 1 to logic 0. Accordingly, the first transmission gate 111 is turned off, and the second transmission gate 112 is turned on. The signal at point A then becomes the inverted clock signal $CK_1'$, as shown at time $T_1$. The rest may be deduced by analogy: the next time the signal at point D changes its logic state, the signal at point A then becomes the clock signal $CK_1$, as shown at time $T_2$. As shown in FIG. 3, the period of the output signal of the second T flip-flop $M_{12}$ is three times as long as that of the clock signal $CK_1$.

Figure 4:
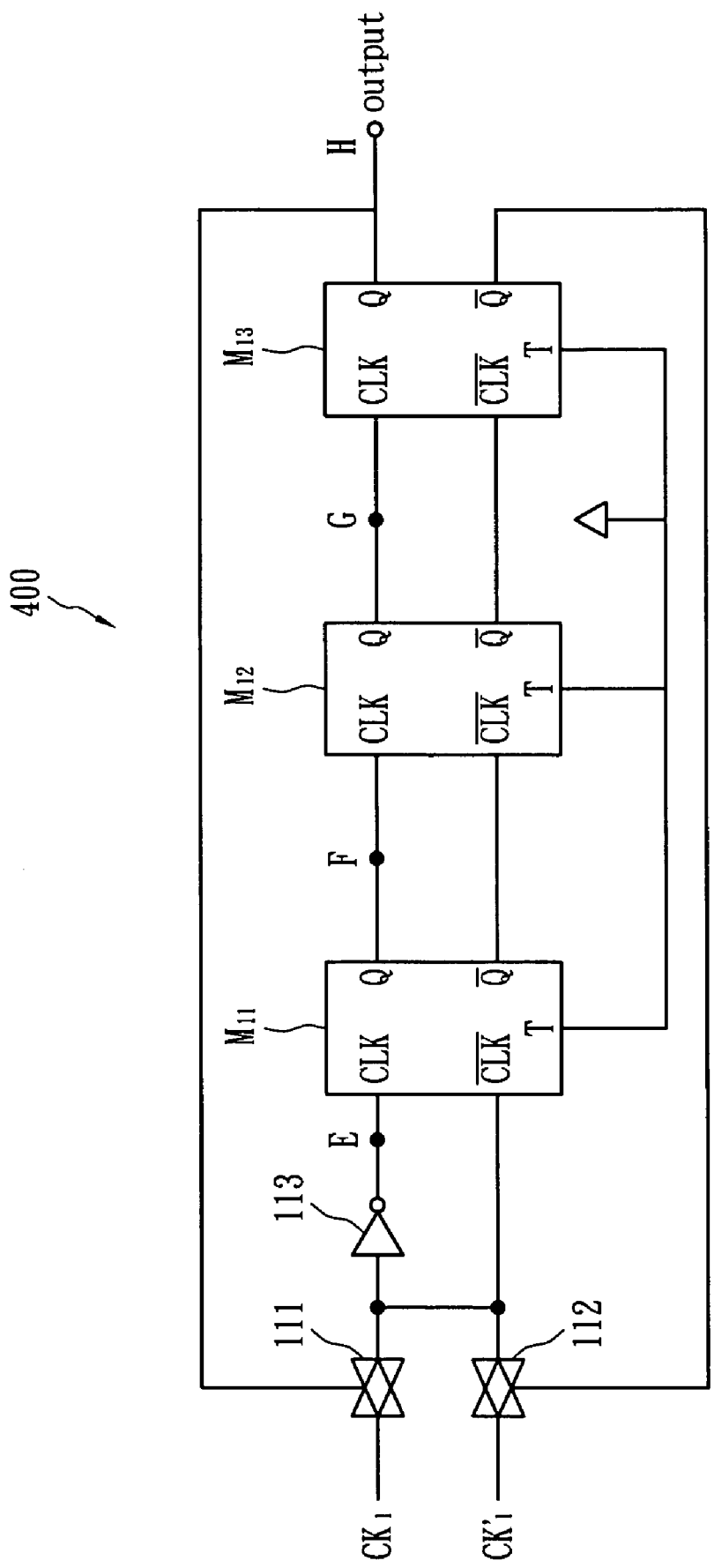
FIG. 4 shows a block diagram of the frequency divider circuit according to the third embodiment of the present invention.

FIG. 4 shows a block diagram of the frequency divider circuit according to another embodiment of the present invention. The frequency divider circuit 400 is the frequency divider circuit 100 with N equal to 3. The frequency divider circuit 400 comprises the T flip-flops $M_{11}$ to $M_{13}$, the first transmission gate 111, the second transmission gate 112 and the inverter 113. The input terminal of the first transmission gate 111 is connected to the clock signal $CK_1$. The output terminal of the first transmission gate 111 is connected to the negative clock terminal of the first T flip-flop $M_{11}$ and the input terminal of the inverter 113. The input terminal of the second transmission gate 112 is connected to the inverted signal $CK_1'$ of the clock signal $CK_1$. The output terminal of the second transmission gate 112 is connected to the negative clock terminal of the first T flip-flop $M_{11}$ and the input terminal of the inverter 113. The output terminal of the inverter 113 is connected to the positive clock terminal of the first T flip-flop $M_{11}$. The positive output terminal of the first T flip-flop $M_{11}$ is connected to the positive clock terminal of the second T flip-flop $M_{12}$. The negative output terminal of the first T flip-flop $M_{11}$ is connected to the negative clock terminal of the second T flip-flop $M_{12}$. The positive output terminal of the second T flip-flop $M_{12}$ is connected to the positive clock terminal of the third T flip-flop $M_{13}$. The negative output terminal of the second T flip-flop $M_{12}$ is connected to the negative clock terminal of the third T flip-flop $M_{13}$. The positive output terminal of the third T flip-flop $M_{13}$ is connected to the control terminal of the first transmission gate 111. The negative output terminal of the third T flip-flop $M_{13}$ is connected to the control terminal of the second transmission gate 112.

Figure 5:
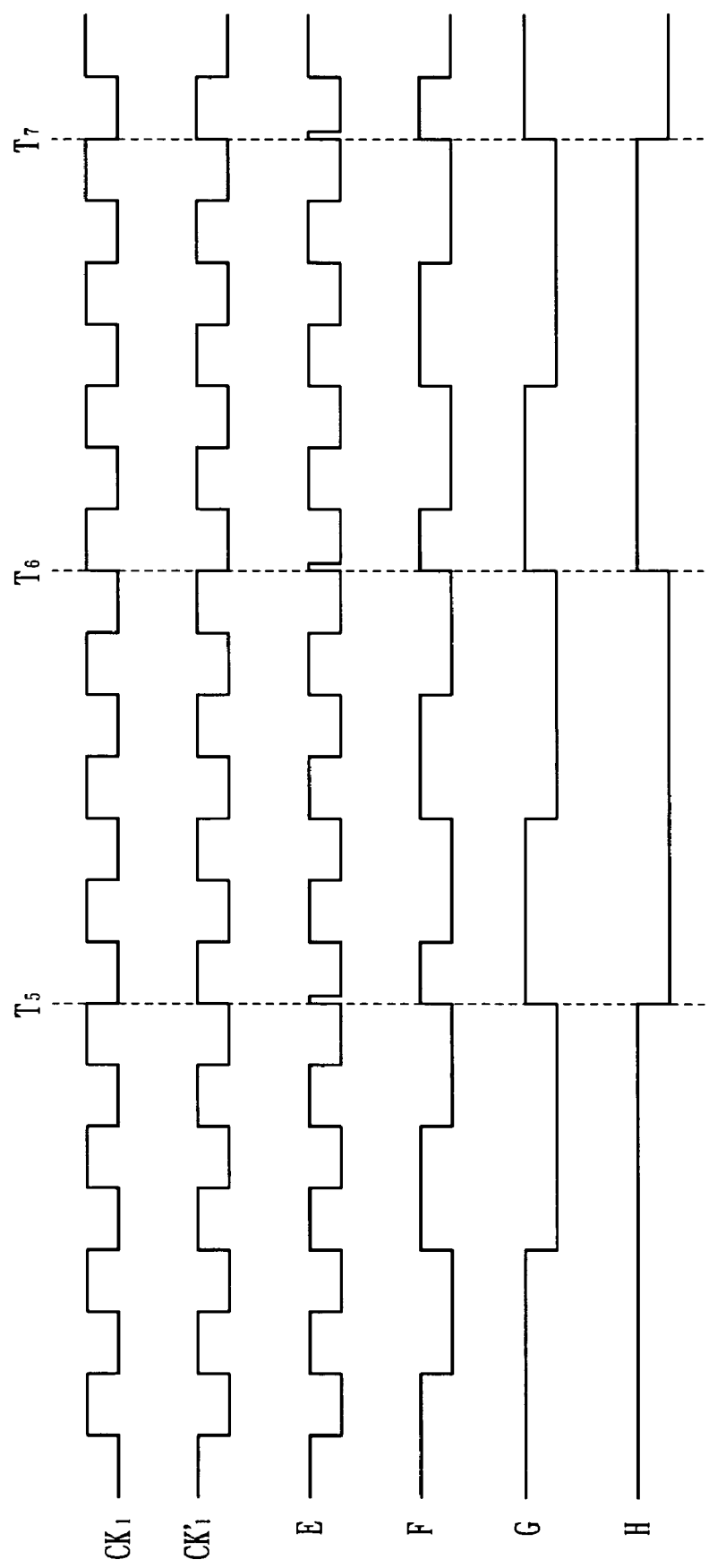
FIG. 5 shows a timing diagram of the voltages in the third embodiment of the present invention.

FIG. 5 shows a timing diagram of voltage on each circuit node in FIG. 4. The initial outputs of the first T flip-flop $M_{11}$, the second T flip-flop $M_{12}$ and the third T flip-flop $M_{13}$ are logic 1. Accordingly, the first transmission gate 111 is turned on, the second transmission gate 112 is turned off, and the signal at point E is the clock signal $CK_1$. At time $T_5$, the signal at point E changes from logic 0 to logic 1, which triggers the first T flip-flop $M_{11}$ such that the signal at point F changes from logic 0 to logic 1. The logic transition at point F triggers the second T flip-flop $M_{12}$ such that the signal at point G changes from logic 0 to logic 1. The logic transition at point G triggers the third T flip-flop $M_{13}$ such that the signal at point H changes from logic 1 to logic 0. Accordingly, the first transmission gate 111 is turned off, and the second transmission gate 112 is turned on. The signal at point E then becomes the inverted clock signal $CK_1'$, as shown at time $T_5$. The rest may be deduced by analogy: the next time the signal at point H changes its logic state, the signal at point E then becomes the clock signal $CK_1$, as shown at time $T_6$. As shown in FIG. 5, the period of the output signal of the third T flip-flop $M_{13}$ is seven times as long as that of the clock signal $CK_1$.

The embodiments of the frequency divider circuit of the present invention require only a plurality of T flip-flops, an inverter and two transmission gates. In CMOS manufacturing process, the inverter and the two transmission gates requires only six transistors. Therefore, the hardware cost of the embodiments of the frequency divider circuit of the present invention has been significantly reduced compared to the aforesaid convntional frequency divider circuits. On the other hand, the embodiments of the frequency divider circuit of the present invention can be adapted to divide-by-$(2^N-1)$ frequency divider circuits merely by increasing the number of T flip-flops without altering the structure thereof. In other words, the embodiments of the frequency divider circuit of the present invention are more versatile and easily expandable compared to the aforesaid conventional frequency divider circuits.

The above-described embodiments of the present invention are intended to be illustrative only. Those skilled in the art may devise numerous alternative embodiments without departing from the scope of the following claims.

What is claimed is:

1. A frequency divider circuit comprising:
   a plurality of T flip-flops connected in series, wherein one of the output terminals of each T flip-flop is connected to one of the clock terminals of the following T flip-flop, the other output terminal of each T flip-flop is connected to the other clock terminal of the following T flip-flop, and the toggle terminal of each T flip-flop is connected to logic 1;
   an inverter with its output terminal connected to one of the clock terminals of a first T flip-flop;
   a first transmission gate connecting a clock signal to the other clock terminal of the first T flip-flop and the input terminal of the inverter; and
   a second transmission gate connecting the inverted signal of the clock signal to the other clock terminal of the first T flip-flop and the input terminal of the inverter;
   wherein a last T flip-flop controls the first transmission gate and the second transmission gate.

2. The frequency divider circuit of claim 1, wherein a first output terminal of the last T flip-flop controls the first transmission gate, and a second output terminal of the last T flip-flop controls the second transmission gate.

3. A frequency divider circuit comprising:
   a plurality of T flip-flops connected in series; and
   a transmission gate circuit connecting a clock signal and the inverted signal thereof to clock terminals of a first T flip-flop;
   wherein the number of logic transitions of each T flip-flop is twice as many as that of the following T flip-flop;
   wherein when the output logic of a last T flip-flop changes, the transmission gate circuit inverts its output signals.

4. The frequency divider circuit of claim 3, wherein the output terminals of each T flip-flop are connected to the clock terminals of the following T flip-flop, and the toggle terminal of each T flip-flop is connected to logic 1.

5. The frequency divider circuit of claim 3, wherein the last T flip-flop controls the transmission gate circuit.

* * * * *